United States Patent [19]

Yau

[11] Patent Number: 5,623,393
[45] Date of Patent: Apr. 22, 1997

[54] MONITOR CONTROL PANEL MOUNTING STRUCTURE

[76] Inventor: Yeong-Kuo Yau, 14F, No. 1, Sec. 4, Nan-King E. Rd., Taipei, Taiwan

[21] Appl. No.: 626,329

[22] Filed: Apr. 2, 1996

[51] Int. Cl.$^6$ ............................... H05K 7/02; H04N 5/64
[52] U.S. Cl. .................. 361/682; 200/296; 348/836; 312/7.2; 361/781; 455/347
[58] Field of Search ................................ 200/293, 294, 200/295, 296, 303, 308; 312/7.2, 223.1, 223.2, 319.2; 348/836, 839; 455/347, 348, 349; 361/600, 627, 631, 632, 643, 682, 683, 681, 807, 808, 809, 825, 832, 781

[56] References Cited

U.S. PATENT DOCUMENTS

| | | | |
|---|---|---|---|
| 3,970,782 | 7/1976 | Fenne | 312/7.2 |
| 5,455,743 | 10/1995 | Miyajima | 361/781 |
| 5,474,372 | 12/1995 | Jung | 312/7.2 |
| 5,493,347 | 2/1996 | Fukuda | 348/836 |
| 5,499,115 | 3/1996 | Kojima et al. | 348/836 |

*Primary Examiner*—Leo P. Picard
*Assistant Examiner*—Lynn D. Feild

[57] ABSTRACT

A monitor control panel mounting structure which includes a control panel pivoted to the housing of a monitor and turned about an axis, a mount fixedly connected to the control panel at the bask side to hold a set of control buttons, wherein the monitor housing has a plurality of tracks extending outwards; the control buttons have a respective lever respectively moved in the tracks, the levers of the control buttons being respectively moved to respective switches on the main board of the monitor for permitting the switches of the main board to be operated through the control buttons when the control panel is turned outwards to move the mount out of the monitor housing, the levers of the control buttons being moved away from the switches of the main board when the control panel is turned inwards to move the mount to the inside of the monitor housing.

1 Claim, 4 Drawing Sheets

5,623,393

MONITOR CONTROL PANEL MOUNTING STRUCTURE

BACKGROUND OF THE INVENTION

The present invention relates to a monitor control panel mounting structure which is simple in structure and easy to install.

Regular monitors commonly have a set of control buttons for the regulation of contract, horizontal position, vertical position, brightness, V-hold, V-size, etc., and an ON/OFF switch for controlling power supply to the main board. FIG. 1 shows a monitor control panel mounting structure according to the prior art. This monitor control panel mounting structure comprises a control panel (10') mounted on the housing (3') of a monitor, a mount (11') fixedly connected to the control panel (10') at the bask side to hold a set of control buttons, an auxiliary board (22') suspended from the mount (11') to hold a set of switches (21'), which are respectively connected to the main board (20') of the monitor by electric wires, and a set of buttons (12') respectively mounted on the mount (11') for controlling the switches (21'). The circuit design of this monitor control panel mounting structure is complicated and difficult to maintain. Furthermore, the installation of the auxiliary board (22') relatively increases the installation cost the structure.

SUMMARY OF THE INVENTION

The present invention has been accomplished to provide a monitor control panel mounting structure which eliminates the aforesaid drawbacks. It is one object of the present invention to provide a monitor control panel mounting structure which is simple in structure. It is another object of the present invention to provide a monitor control panel mounting structure which is inexpensive to manufacture. It is another object of the present invention to provide a monitor control panel mounting structure which keeps the control buttons from sight when closed.

According to the preferred embodiment of the present invention, the monitor control panel mounting structure comprises a control panel pivoted to the housing of a monitor and turned about an axis, a mount fixedly connected to the control panel at the bask side to hold a set,of control buttons, wherein the monitor housing has a plurality of tracks extending outwards, the control buttons have a respective lever respectively moved in the tracks, the levers of the control buttons being respectively moved to respective switches on the main board of the monitor for permitting the switches of the main board to be operated through the control buttons when the control panel is turned outwards to move the mount out of the monitor housing, the levers of the control buttons being moved away from the switches of the main board when the control panel is turned inwards to move the mount to the inside of the monitor housing.

DETAILED DESCRIPTION OF THE PREFERRED EMBODIMENT

Figure 1:
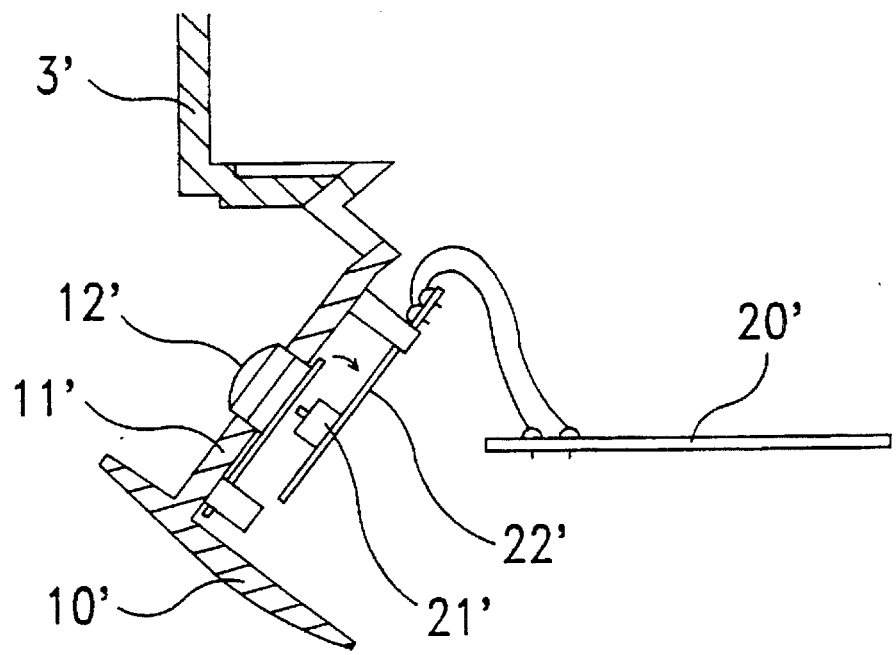
FIG. 1 is a sectional view of a monitor control panel mounting structure according to the prior art when opened.
Figure 2A:
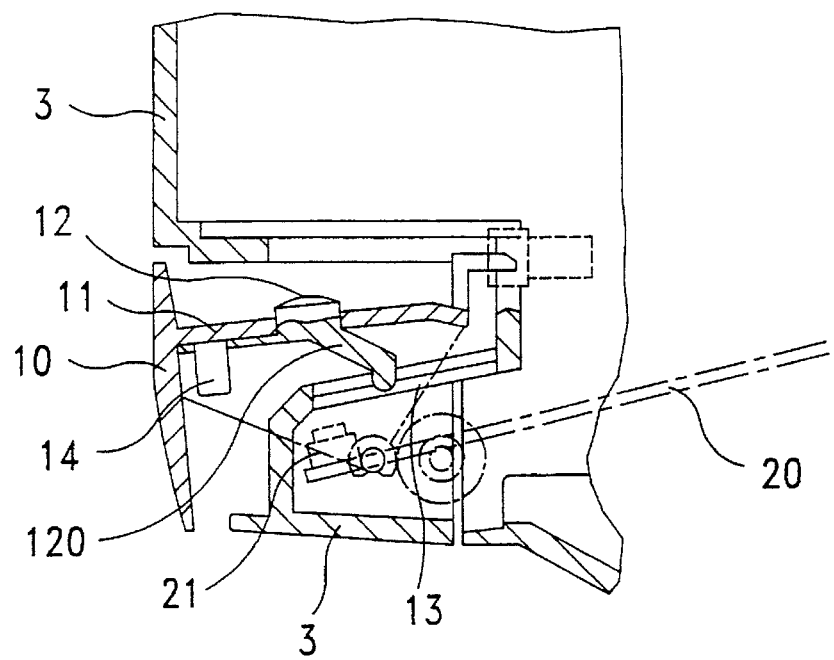
FIG. 2A is a sectional view of a monitor control panel mounting structure according to the present invention when closed.
Figure 3:
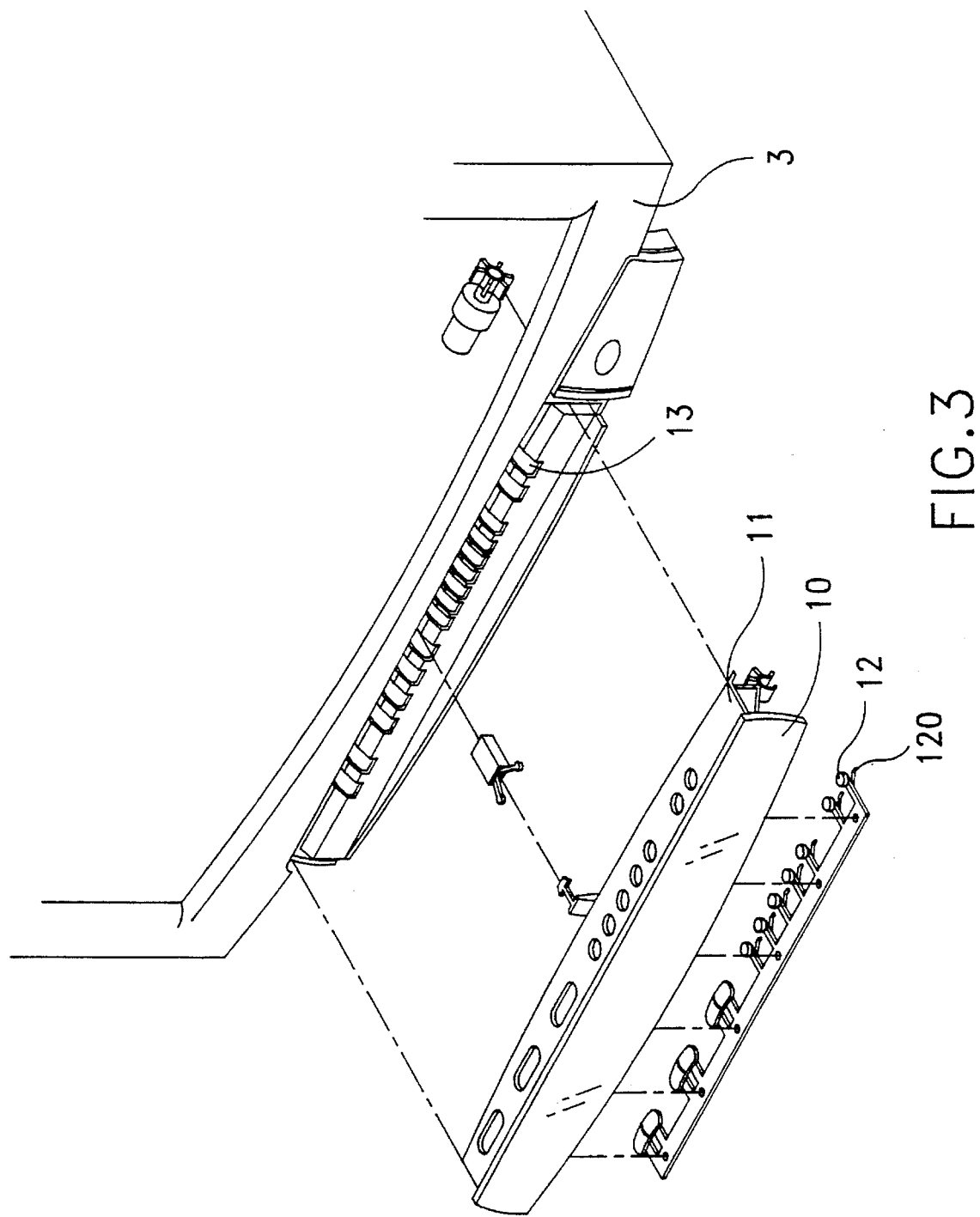
FIG. 3 is an exploded view of the monitor control panel mounting structure shown in FIG. 2A.

Referring to FIGS. 2A and 3, a monitor control panel mounting structure in accordance with the present invention is generally comprised of a monitor housing 3, a control panel 10 horizontally mounted on the monitor housing 3 at the front side near the bottom and turned about an axis, a mount 11 perpendicularly and integrally raised from the back side of the control panel 10 and having a downward flange 14, a set of control buttons 12 respectively mounted on the mount 11, and a plurality of levers 120 respectively extending form the control buttons 12 and moved in respective tracks 13 on the monitor housing 3.

Figure 4A:
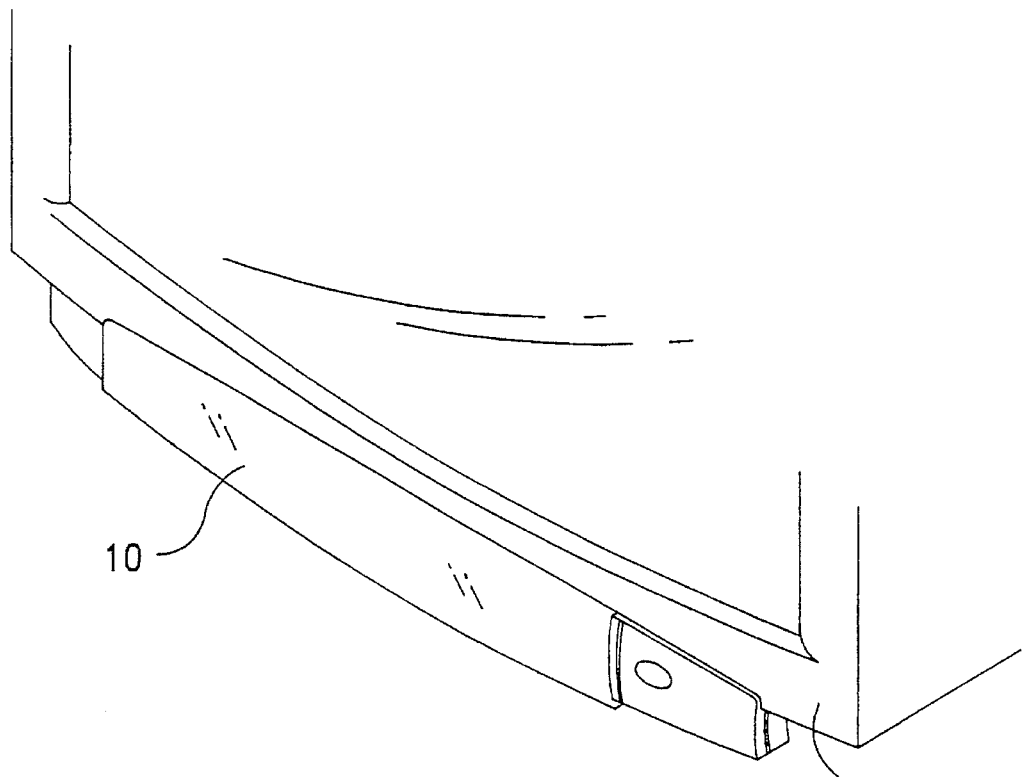
FIG. 4A is an elevational view of FIG. 2A.

Referring to FIG. 4A and FIG. 2A again, when the control panel 10 is closed, it is disposed in flush with the front side of the monitor housing 3. The monitor housing 3 has an outward flange 21 suspending below the control panel 10, and a main board 20 on the inside. The main board 20 has switches 21 respectively disposed adjacent to the front ends of the tracks 13. When the control panel 10 is closed, the levers 120 of the control buttons 12 are maintained in the tracks 13 away from the switches 21 of the main board 20.

Figure 2B:
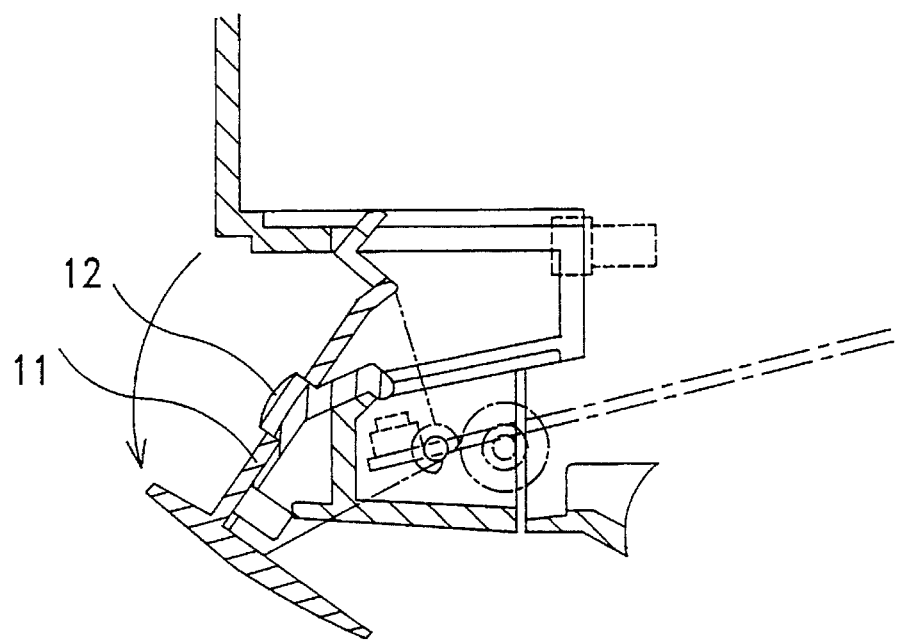
FIG. 2B is another sectional view of the monitor control panel mounting structure shown in FIG. 2A, showing the control panel opened.
Figure 4B:
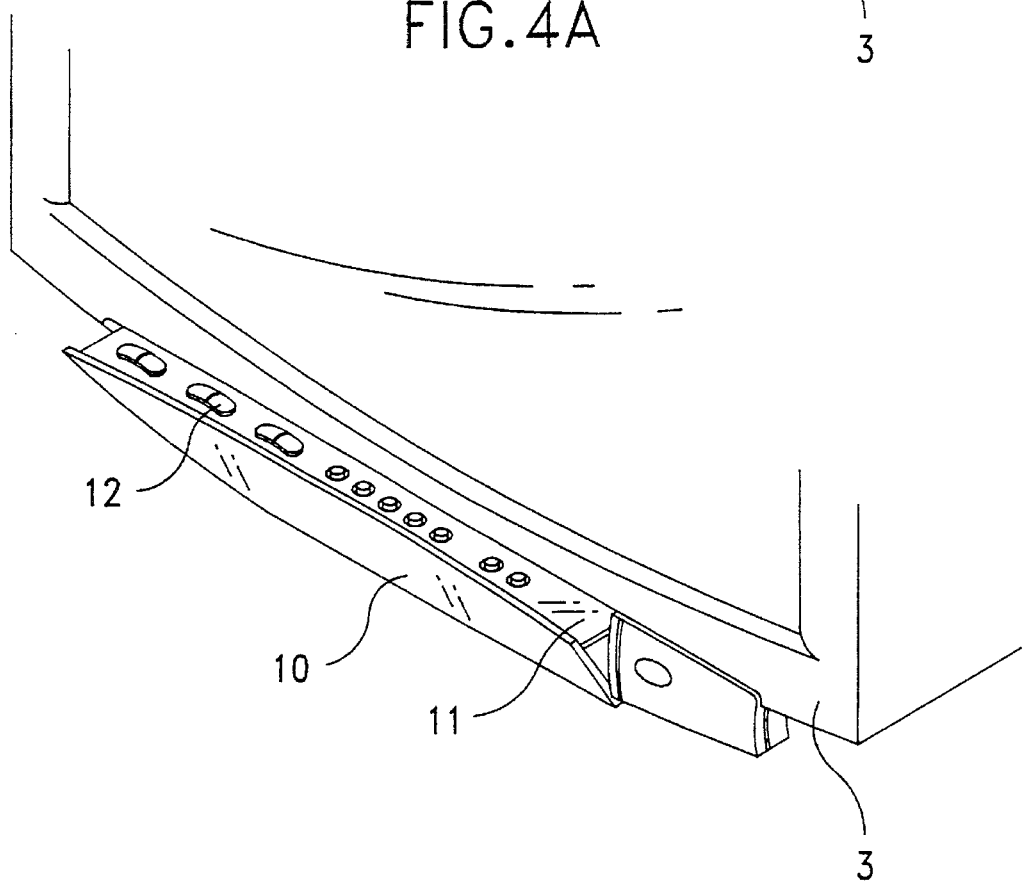
FIG. 4B is an elevational view of FIG. 2B.

Referring to FIG. 4B and FIG. 2B again, when the control panel 10 is turned outwards and opened, the mount 11 is moved out of the monitor housing 3 for allowing the user to operate the control buttons 12, the downward flange 14 of the mount 11 is stopped at the front side of the monitor housing 3 to hold the control panel 10 in the open position, and the levers 120 of the control buttons 12 are moved to the front ends of the tracks 13 respectively and slightly stopped at the switches 21, and therefore the user can operate the switches 21 through the control buttons 12.

While only one embodiment of the present invention has been shown and described, it will be understood that various modifications and changes could be made without departing from the spirit and scope of the invention.

What the invention claimed is:

1. A monitor control panel mounting structure of the type comprising a monitor housing, a main board mounted inside said monitor housing, a control panel pivoted to said monitor housing at a front side and turned about an axis, said control panel having a mount perpendicularly disposed at a back side, a set of control buttons installed in said mount for operation to control said main board, wherein said monitor housing has a plurality of tracks extending outwards; said main board has a plurality of switches respectively disposed adjacent to said tracks at an outer side; said control panel has a plurality of levers respectively extending from said control buttons and moved in said tracks, said levers being respectively moved to said switches of said main board for permitting said switches of said main board to be operated through said control buttons when said control panel is turned outwards to move said mount out of said monitor housing, said levers of said control buttons being moved away from said switches of said main board when said control panel is turned inwards to move said mount to the inside of said monitor housing.

\* \* \* \* \*